United States Patent
Desroches (10) Patent No.: US 6,392,442 B1
(45) Date of Patent: May 21, 2002

(54) DRIVER CIRCUIT THAT COMPENSATES FOR SKIN EFFECT LOSSES

(75) Inventor: Alan R. Desroches, San Jose, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/704,250

(22) Filed: Oct. 30, 2000

(51) Int. Cl.[7] ............................................... H03K 17/16
(52) U.S. Cl. .............................. 326/83; 326/30; 326/86; 326/90; 710/101; 710/126
(58) Field of Search .............................. 326/83, 86, 90, 326/30; 710/101, 126; 375/220; 333/17.3, 22 R, 32

(56) References Cited

U.S. PATENT DOCUMENTS

| | | | |
|---|---|---|---|
| 5,559,441 A | * | 9/1996 | Desroches ................... 324/647 |
| 6,087,853 A | * | 7/2000 | Huber et al. ................... 326/83 |
| 6,137,317 A | * | 10/2000 | Griffin .......................... 326/87 |
| 6,157,215 A | * | 12/2000 | Gabara et al. ................. 326/83 |

OTHER PUBLICATIONS

Dally, William J, et al., "Transmitter Equalization For 4Gb/s Signalling" Proc. of Hot Interconnects '96, pp. 29–39, Stanford University, Aug. 15–17, 1996. Also in IEEE Micro, pp. 48–56, Jan./Feb. 1997.

* cited by examiner

*Primary Examiner*—Michael Tokar
*Assistant Examiner*—Vibol Tan
(74) *Attorney, Agent, or Firm*—David A. Plettner (57) ABSTRACT

A driver circuit compensates for skin effect losses in a transmission line by using a lower impedance when data switches at the maximum switching rate, and using a higher output impedance when data switches at less than the maximum switching rate. As is known in the art, skin-effect resistance causes the impedance of a transmission line to be higher for high-frequency components. A driver in accordance with the present invention compensates for this effect by lowering the output impedance of the driver when transmitting high-frequency components having alternating data values, and using a higher output impedance when transmitting low frequency components having consecutive data values. When transmitting low-frequency consecutive high or low data values using a higher output impedance, the resulting voltage divider formed by the output impedance of the driver at the beginning of the transmission line and the termination resistors at the end of the transmission line causes the high and low DC levels at the end of the transmission line to move closer to the detection threshold of the receiver circuit, thereby causing the next isolated low or high pulse, respectively, to start from a point closer to the threshold. Furthermore, when transmitting high-frequency alternating values at the maximum switching rate using a lower output impedance, the resulting voltage divider produces a larger signal swing in the signal received by the receiver circuit. The result is that all pulses cross the receiver threshold with an excellent "eye opening", thereby ensuring detection by the receiver circuit.

11 Claims, 6 Drawing Sheets

DRIVER CIRCUIT THAT COMPENSATES FOR SKIN EFFECT LOSSES

FIELD OF THE INVENTION

The present invention relates to data transmission in digital systems. More specifically, the present invention relates to a driver that compensates for skin effect losses of the interconnection media by using a lower impedance when data switches at the maximum switching rate and using a higher impedance when data switches at less than the maximum switching rate.

DESCRIPTION OF THE RELATED ART

In the art of digital signal processing, switching frequencies continue to increase. As is known in the art, the problems associated with transmitting high-frequency signals tend to be more difficult to solve when designing interconnect fabrics, which link together integrated circuits, circuit boards, and the like.

At high frequencies, such as 100 MHz and above, current is primarily carried by the outer skin of the conductor. Skin-effect resistance causes the attenuation of a conventional transmission line to increase with frequency. However, this attenuation is only present for the high-frequency components of the signal, and does not effect the low-frequency components. This phenomenon causes intersymbol interference, which degrades noise margin and reduces the maximum frequency at which the system can operate.

Figure 1A:
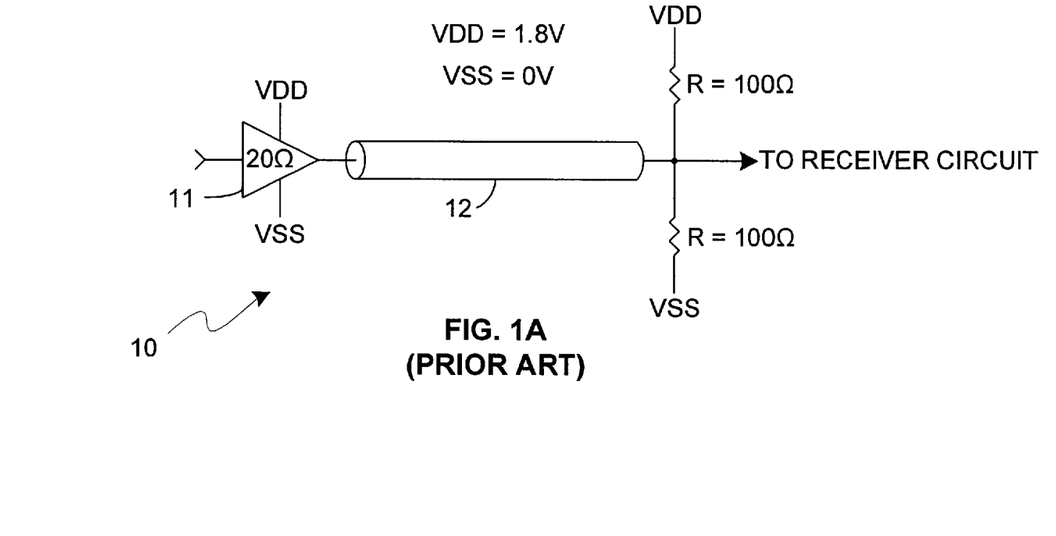
FIG. 1A shows a prior art transmission circuit, which includes a driver having an output impedance of 20Ω that drives a terminated transmission line.

FIG. 1A shows a prior art transmission circuit 10, which includes a driver 11 having an output impedance of 20Ω. Driver 11 drives high signals toward VDD and drives low signals toward VSS. In FIG. 1A, typical values of 1.8 V for VDD and 0.0 V for VSS are shown. The driver is coupled to a transmission line 12. The other end of transmission line 12 is coupled to a receiver circuit, which is not shown in FIG. 1A, and is terminated with a 100Ω resistor coupled to VDD and a 100Ω resistor coupled to VSS.

Figure 1B:
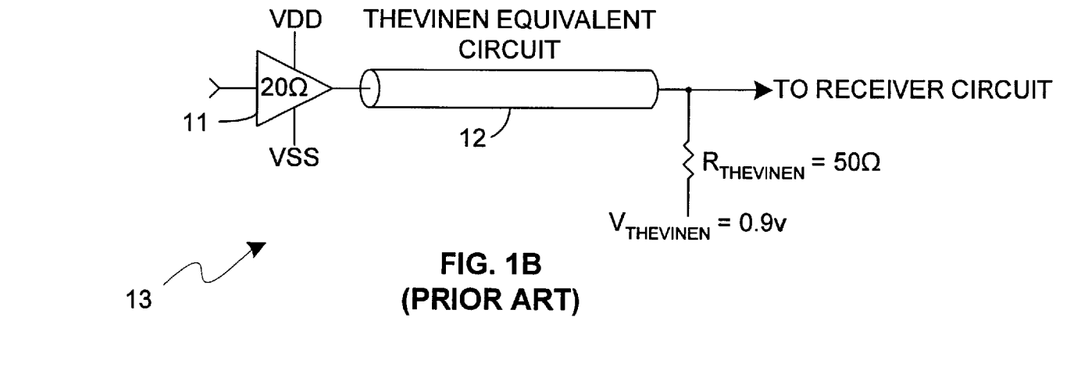
FIG. 1B shows the Thevinen equivalent circuit of the prior art transmission circuit of FIG. 1A.

FIG. 1B shows the Thevinen equivalent circuit 13 of the prior art transmission circuit 10 of FIG. 1A. The two terminal resistors in FIG. 1A can be modeled as a single resistor having a Thevinen resistance of 50106 and coupled to a Thevinen voltage of 0.9 V. Consider that driver 11 is driving transmission line 12 high for an extended period of time. The 20Ω output impedance of driver 11 forms a voltage divider with the 50Ω Thevinen resistance of the termination resistors. Accordingly, the receiver circuit will be provided with a DC signal of 1.54 V. Similarly, if driver 11 is driving transmission line 12 line low for an extended period of time, the voltage divider will provide the receiver circuit with a DC signal of 0.26 V.

If transmission line 12 where lossless, the signal provided to the receiver circuit would swing between the high and low DC values. Accordingly, the signal swing would be 1.28 V. However, because of skin effect losses of transmisssion line 12, the signal swing will be attenuated when the signal is switching at high frequencies. A nominal attenuation for a circuit such as that shown in FIG. 1A is 40%. Of course, the magnitude of attenuation will vary with frequency and the characteristics of transmission line 12. Applying the nominal attenuation to the lossless signal swing results in a signal swing of 0.77 V.

Figure 2:
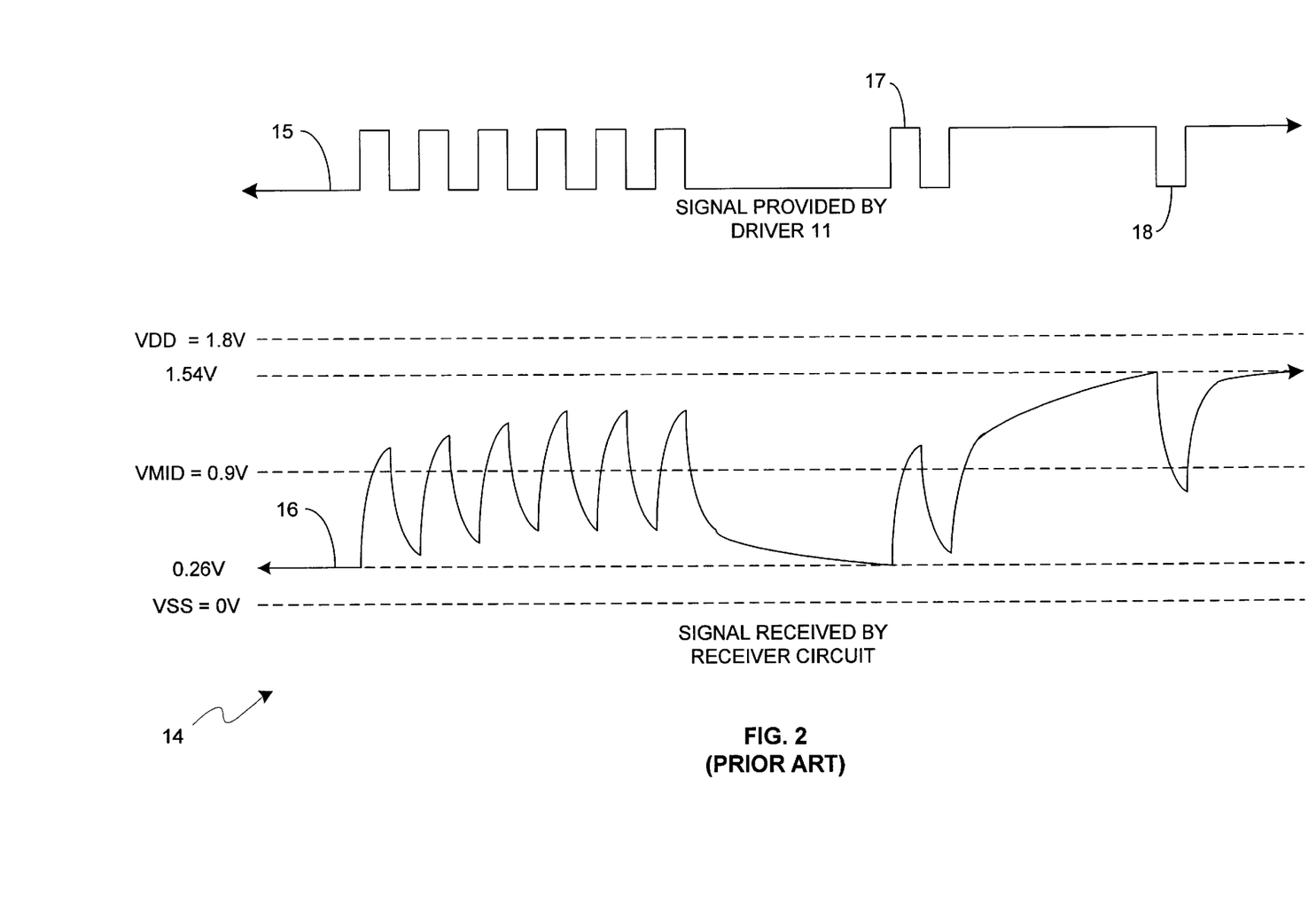
FIG. 2 shows a timing diagram of a signal applied to the driver of FIG. 1A and the resulting waveform observed at a receiver circuit.

FIG. 2 shows a timing diagram of a signal 15 applied to driver 11 in FIG. 1A and the resulting waveform 16 observed at the receiver circuit. Assume that signal 15 has been low for an extended period of time, and therefore signal 16 has discharged down to the low DC value of 0.26 V, as described above. When the first pulse of a series of high-frequency pulses is transmitted at driver 11, signal 16 will rise 0.77 V, which is the signal swing calculated above. Accordingly, the pulse will rise to 1.04 V, which is just above the receiver detection threshold of 0.9 V. Note that the "eye opening" of this first pulse in signal 16 is very small, so there is little chance that the pulse will be properly detected by the receiver circuit.

As the series of high-frequency pulses continues to be transmitted, signal 16 centers itself about the average signal value, producing progressively better eye openings for the remaining pulses in the series. After the last pulse in the series, signal 15 remains low for several cycles, and signal 16 once again discharges down to the low DC value of 0.26 V.

After several low cycles, signal 15 once again goes high at pulse 17. Once again, the result is a pulse in signal 16 with a very small eye opening. Signal 15 then goes low for a cycle, and then goes high and remains high for several cycles. The result is that signal 16 charges up to the high DC value of 1.54 V.

At pulse 18, signal 15 goes low for a single cycle. Since the signal swing is 0.77 V, and the signal starts at 1.54 V, signal 16 will only fall to 0.77 V, which is just below the receiver threshold of 0.9 V. Accordingly, the pulse in signal 16 produced by pulse 18 in signal 15 also has a very small eye opening.

Now consider what happens if the circuit designer attempts to compensate for the small eye opening by using a lower output impedance in driver 11. The high-frequency signal swing of signal 16 will increase. However, the resulting voltage divider created by the termination resistors and the output impedance of the driver will cause the low DC value to become lower and the high DC value to become higher. Accordingly, while the signal swing is larger, the signal starts from a point farther from the receiver threshold, thereby negating the larger signal swing. Similarly, if the designer uses a higher output impedance in driver 11, the starting points will move closer to the receiver threshold, but the signal swing will decrease.

This problem of skin effect losses at high frequencies was addressed by William J. Dally and John Poulton in a paper entitled "Transmitter Equalization for 4 Gb/s Signaling", which was first presented at the Proceedings of Hot Interconnects at Stanford University in August of 1996. This paper is hereby incorporated by reference. To solve the problem, Dally et al. propose using a 4 GHz finite impulse response (FIR) filter in a current-mode transmitter. The FIR filter increases the width and height of the "eye opening", thereby making it easier to detect the pulse. In essence, the FIR filter prevents the transmission line from discharging down to a low level or charging to a high level. Unfortunately, the FIR filter consumes a relatively large amount of logic on an integrated circuit, and increases propagation delay.

SUMMARY OF THE INVENTION

The present invention is a driver circuit that compensates for skin effect losses in a transmission line by using a lower output impedance when data switches at the maximum switching rate, and using a higher output impedance when data switches at less than the maximum switching rate. As is known in the art, skin-effect resistance causes the impedance of a transmission line to be higher for high-frequency signal components. The present invention compensates for this effect by lowering the output impedance of the driver when transmitting high-frequency components having alternating data values, and using a higher output impedance when transmitting low frequency components having consecutive data values. When transmitting low-frequency consecutive high or low data values using a higher output impedance, the resulting voltage divider formed by the output impedance of the driver at the beginning of the transmission line and the termination resistors at the end of the transmission line causes the high and low DC levels at the end of the transmission line to move closer to the detection threshold of the receiver circuit, thereby causing the next isolated low or high pulse, respectively, to start from a point closer to the threshold. Furthermore, when transmitting high-frequency alternating values at the maximum switching rate using a lower output impedance, the resulting voltage divider produces a larger signal swing in the signal received by the receiver circuit. The result is that all pulses cross the receiver threshold with an excellent "eye opening", thereby ensuring detection by the receiver circuit.

In one embodiment, the present invention uses a higher output impedance if the value being transmitted is the same as the previous value transmitted, and uses a lower output impedance if the value being transmitted is different than the previous value being transmitted. One pair of transistors are used to drive the output signal for every bit transmitted. A second pair of transistors are only used when the previous transmitted value is different from the value currently being transmitted. In this situation, the second pair of transistors operate in parallel with the first pair to lower the output impedance of the driver. If the value being transmitted is the same as the previous value transmitted, the second pair of transistors remain off and the data value is transmitted using a higher output impedance. The previous values are stored in latches, and a series of gates are used to compare the current and previous values to determine the impedance mode.

The present invention offers several advantages over the (FIR) finite impulse response filter technique taught in the prior art. First, the implementation is very simple and consumes relatively few gates of the integrated circuit. Also, the driver of the present invention introduces very little propagation delay. In addition, the present invention is easily extended to future and past generations of MOS technology.

DETAILED DESCRIPTION OF THE PREFERRED EMBODIMENTS

Figure 3:
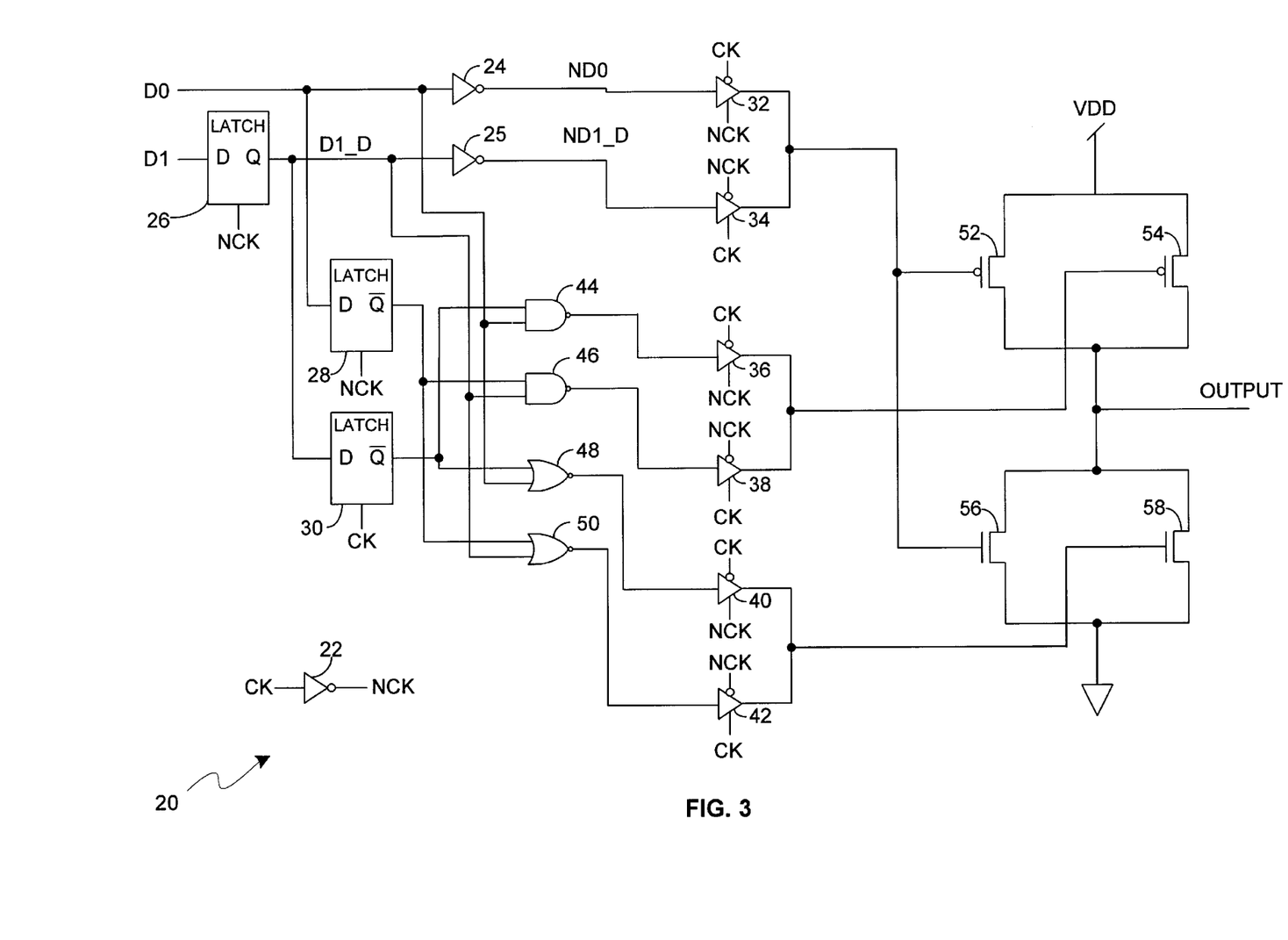
FIG. 3 is a schematic diagram of a driver in accordance with the present invention.

The present invention is a driver circuit that compensates for skin effect losses in a transmission line by using a lower impedance when data switches at the maximum switching rate, and using a higher output impedance when data switches at less than the maximum switching rate. As discussed above, one prior art method of compensating for the effects of skin-effect resistance was to provide a FIR filter in the driver circuit. The present invention uses a different approach. Since skin-effect resistance causes the impedance of a transmission line to be higher for high-frequency components, the present invention lowers the output impedance of the driver when transmitting high-frequency components having alternating data values, and raises the output impedance when transmitting low-frequency components having consecutive data values. When transmitting low-frequency consecutive high or low data values using a higher output impedance, the resulting voltage divider formed by the output impedance of the driver at the beginning of the transmission line and the termination resistors at the end of the transmission line causes the high and low DC levels at the end of the transmission line to move closer to the detection threshold of the receiver circuit, thereby causing the next isolated low or high pulse, respectively, to start from a point closer to the threshold. Furthermore, when transmitting high-frequency alternating values at the maximum switching rate using a lower output impedance, the resulting voltage divider produces a larger signal swing in the signal received by the receiver circuit. The result is that all pulses cross the receiver threshold with an excellent "eye opening", thereby ensuring detection by the receiver circuit FIG. 3 is a schematic diagram of a driver 20 in accordance with one embodiment of the present invention. In this embodiment, a higher output impedance is used if the value being transmitted is the same as the previous value transmitted, and a lower output impedance is used if the value being transmitted is different than the previous value being transmitted. Driver 20 comprises invertors 22, 24, and 25, latches 26, 28 and 30, tri-state buffers 32, 34, 36, 38, 40, and 42, NAND gates 44 and 46, NOR gates 48 and 50, PFET transistors 52 and 54, and NFET transistors 56 and 58. Note that the term PFET will be used herein to reference a p-channel metal-oxide semiconductor field effect transistor (MOSFET). This type of transistors is also commonly known in the art as a PMOS transistor. Similarly, the term NFET will be used herein to reference an n-channel MOSFET. This type of transistors is also commonly known in the art as an NMOS transistor.

The driver and data are clocked by the signal CK, with inverter 22 providing the signal NCK, which is also used by driver 20. Data to be transmitted arrives via the signals D0 and D1. The data becomes valid at the rising edge of CK, and remains valid until the next rising edge of CK. Data is transmitted to a transmission line at the signal OUTPUT. The data is transmitted every rising and falling edge of CK, and alternates between the data provided by D0 and D1. Accordingly, every other data bit transmitted is provided by D0. Likewise, every other data bit transmitted is provided by D1.

Data signal D0 is provided to inverter 24 to form the signal ND0, which in turn is provided to tri-state buffer 32. Tri-state buffer 32 is enabled whenever CK is low and NCK is high. As mentioned above, D0 (and therefore, ND0) both become valid with the rising edge of CK. Accordingly, buffer 32 transmits ND0 during the second half of the cycle when CK is low and NCK is high. Since tri-state buffer 34 is only enabled when CK is high and NCK is low, buffer 34 is in high-impedance mode when buffer 32 is transmitting ND0. Accordingly, when CK is low and NCK is high the value provided by ND0 is used to drive transistors 52 and 56. If D0 is "1" then ND0 is "0" and PFET transistor 52 is turned on, NFET transistor 56 is turned off, and OUTPUT is driven to "1". Similarly, if D0 is "0" then ND0 is "1", PFET transistor 52 is turned off, NFET transistor 56 is turned on, and OUTPUT is driven to "0".

The signal D1 is provided to latch 26 and is delayed by one-half of a clock cycle to form the signal D1_D. Latch 26 acts as a passthrough when NCK is high, and latches the value with the when NCK is low The signal D1_D is then provided to inverter 25 to form the signal ND1_D, which in turn is provided to tri-state buffer 34. When CK becomes high and NCK becomes low, tri-state buffer 32 enters high-impedance mode and the value of ND1_D is driven out by buffer 34. Therefore, when CK is high and NCK is low, the value provided by ND1_D is used to drive transistors 52 and 56. If D1_D is "1" then ND1_D is "0", PFET transistor 52 is turned on, NFET transistor 56 is turned off, and OUTPUT is driven to "1". Similarly, if D1_D is "0" then ND1_D is "1", PFET transistor 52 is turned off, NFET transistor 56 is turned on, and OUTPUT is driven to "0".

Note that either transistor 52 or 56 is switched on for every data bit transmitted. However, the same is not true of transistors 54 and 58. These transistors are only used when the previous transmitted value is different, and the driver transmits the current value using a lower impedance. Table 1 is a truth table which illustrates when transistors 54 and 58 should be switched on.

TABLE 1

| Current Value D0 or D1_D | Previous Value D1_D or D0 | Impedance | Transistor 54 | Transistor 58 |
| --- | --- | --- | --- | --- |
| 0 | 0 | High | Off | Off |
| 0 | 1 | Low | Off | On |
| 1 | 0 | Low | On | Off |
| 1 | 1 | High | Off | Off |

Note that the current value can be D0 and the previous value can be D1_D, or the current value can be D1_D and the previous value can be D0. Also note that when the current value being transmitted is different from the previous value transmitted, the states of transistors 54 and 58 mirror the states of transistors 52 and 56, respectively, to transmit the value with a lower impedance. When the value being transmitted is the same as the previous value, transistors 54 and 58 are off, and the value is transmitted with a higher impedance.

Latches 28 and 30 are used to store the previous values and have inverting outputs. Each latch acts as a passthrough when the clock signal applied to the latch is high, and latches the value with the clock signal applied to the latch is low. Latch 30 receives its "D" input from the signal D1_D. Latch 30 stores the previous value of D1_D when CK is low and NCK is high. Since CK is low and NCK is high, tri-state buffers 36 and 40 are enabled and tri-state buffers 38 and 42 are in high-impedance mode. NAND gate 44 compares the previous value transmitted via D1_D with the current value being transmitted by D0. If the current value being transmitted is "1" and the previous value being transmitted was "0" (which is inverted to "1" by the inverting output of latch 30), the output of NAND gate 44 will be "0", which will turn PFET transistor 54 on to transmit the value "1" using a lower impedance. Otherwise transistor 54 will remain off. Similarly, NOR gate 48 compares the previous value transmitted via D1_D with the current value being transmitted by D0. If the current value being transmitted is "0" and the previous value being transmitted was "1" (which is inverted to "0" by the inverting output of latch 30), the output of NOR gate 48 will be "1", which will turn NFET transistor 58 on to transmit the value "0" using a lower impedance. Otherwise transistor 58 will remain off.

Latch 28 receives its "D" input from the signal D0. Accordingly, when NCK is low and CK is high, latch 28 is storing the previous value of D0. Since NCK is low and CK is high, tri-state buffers 38 and 42 are enabled and tri-state buffers 36 and 40 are in high-impedance mode. NAND gate 46 compares the previous value transmitted via D0 with the current value being transmitted by D1_D. If the current value being transmitted is "1" and the previous value being transmitted was "0" (which is inverted to "1" by the inverting output of latch 28), the output of NAND gate 46 will be "0", which will turn PFET transistor 54 on to transmit the value "1" using a lower impedance. Otherwise transistor 54 will remain off. Similarly, NOR gate 50 compares the previous value transmitted via D0 with the current value being transmitted by D1_D. If the current value being transmitted is "0" and the previous value being transmitted was "1" (which is inverted to "0" by the inverting output of latch 28), the output of NOR gate 50 will be "1", which will turn NFET transistor 58 on to transmit the value "0" using a lower impedance. Otherwise transistor 58 will remain off.

Figure 4:
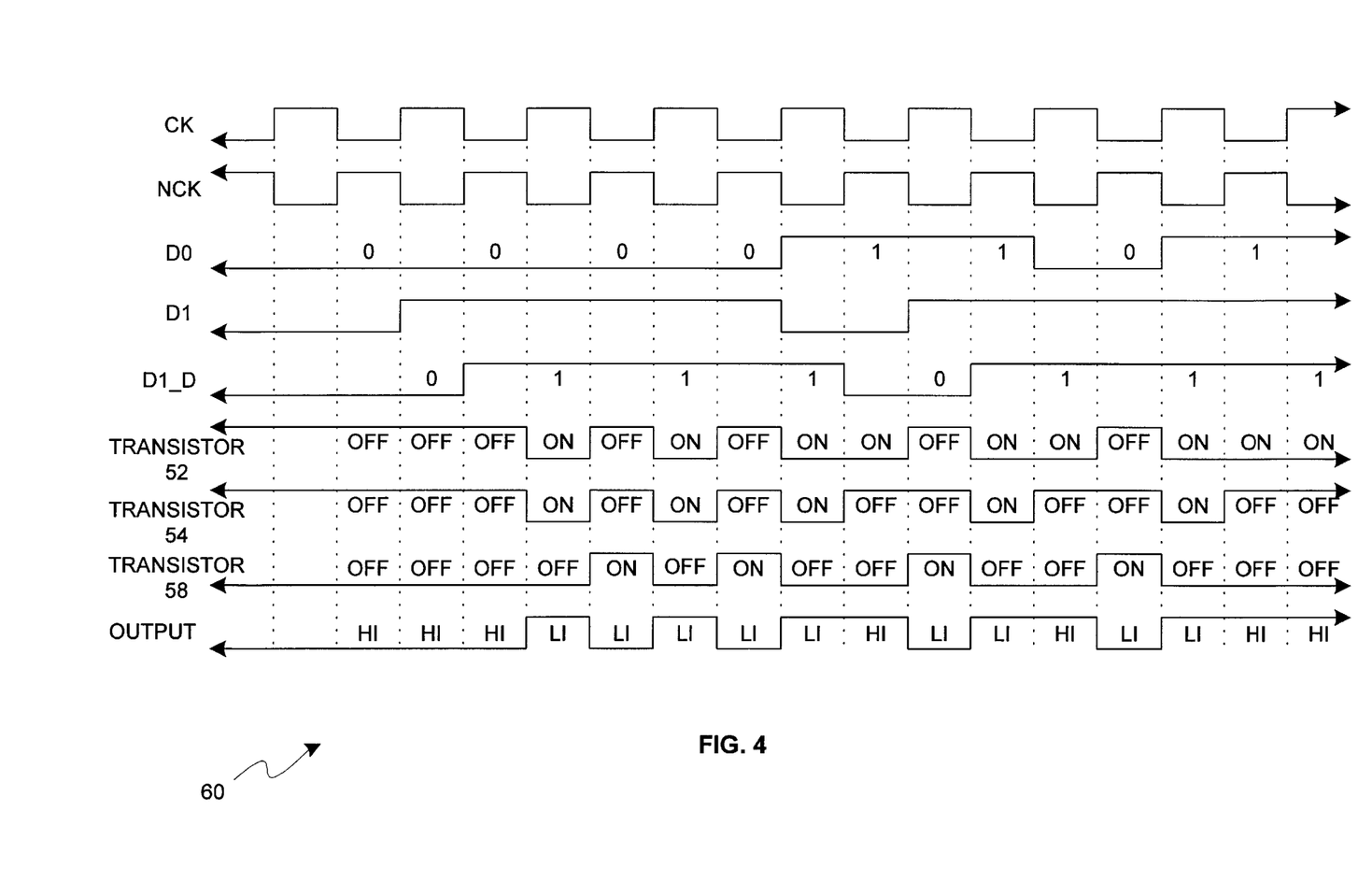
FIG. 4 shows a collection of timing diagrams and illustrates how the driver of FIG. 3 transmits a stream of data.

FIG. 4 shows a collection of timing diagrams 60 and illustrates how driver 20 transmits a stream of data. In FIG. 4, the stream of data transmitted is "0001010110110111". Assume that before the first bit is transmitted, a stream of "0"s has been transmitted. As discussed above, D0 and D1 each carry alternate bits of the data stream. Accordingly, the bits "00001101" are carried by D0, as shown in FIG. 4 at the timing diagram of D0, and the bits "01110111" are carried by D1, as shown in FIG. 4 at the timing diagram of D1_D. The transmitted bit stream "0001010110110111" is reflected in the timing diagram of transistor 52 as a series of OFFs and ONs. Note that since transistor 52 is a PFET that couples OUTPUT to VDD, the actual signal levels are the inverse of the values transmitted. Although not shown in FIG. 4, the signal levels of the timing diagram of transistor 56 are identical to those of transistor 52 since both transistors receive the same signal from tri-state buffers 32 and 34. However, the series of OFFs and ONs are toggled because transistor 56 is an NFET that couples OUTPUT to ground.

Note the timing diagram of PFET transistor 54. There are five bit transmissions where the bit being transmitted is "1", and the previous bit transmitted was "0". Transistor 54 is on during these bit transmissions. Similarly, note the timing diagram of NFET transistor 58. There are four bit transmissions where the bit being transmitted is "0", and the previous bit transmitted was "1". Transistor 58 is on during these bit transmissions.

The result is shown in the timing diagram of the signal OUTPUT. Bit transmissions that occurred at a lower impedance are labeled "LI", and bit transmissions that occurred at a higher impedance are labeled "HI". Note that when the signal OUTPUT switches at a faster rate, the signal is transmitted at a lower impedance, and when the signal OUTPUT switches at a slower rate, the signal is transmitted with a higher impedance, thereby compensating for skin-effect resistance.

In one embodiment, driver 20 produces a 40Ω output impedance when the driver is operating in the high-impedance mode, and produces a 10Ω output impedance when the driver is operating in the low-impedance mode. For highest performance, the transmission line, such as a printed circuit board trace, should be terminated at the receiver.

Figure 5A:
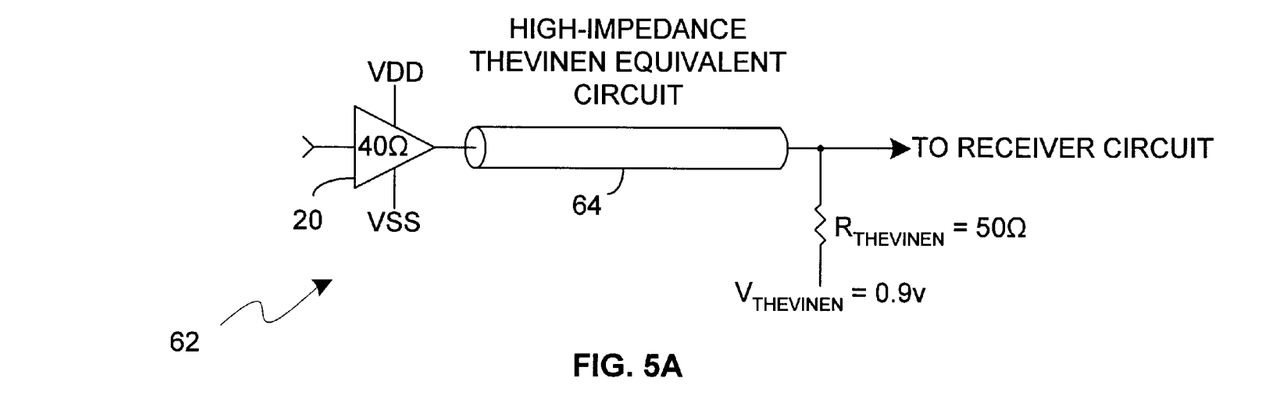
FIG. 5A shows the Thevinen equivalent circuit of the driver of FIG. 3 when the driver is driving a transmission line using a high output impedance of 40Ω.
Figure 5B:
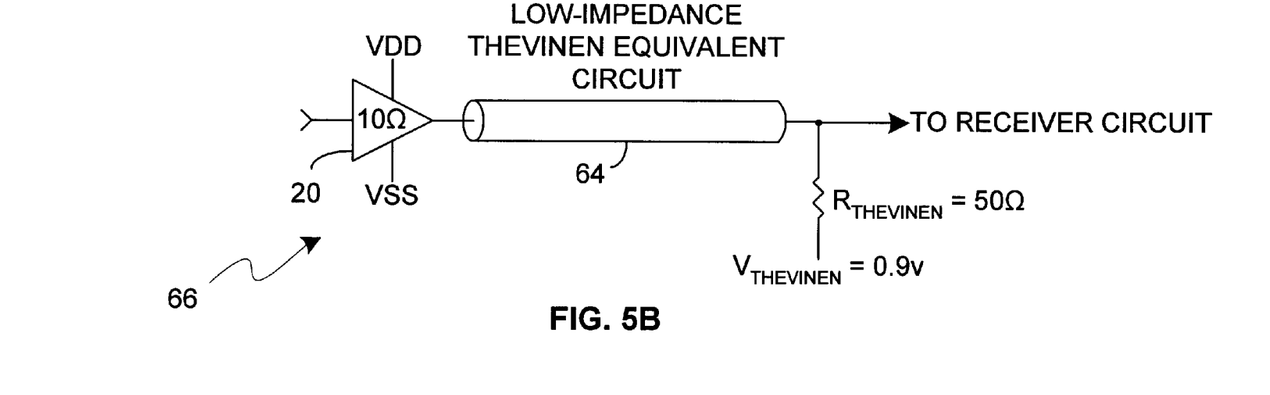
FIG. 5B shows the Thevinen equivalent circuit of the driver of FIG. 3 when the driver is driving the transmission line using a low output impedance of 10Ω.

FIG. 5A shows the Thevinen equivalent circuit when driver 20 is driving transmission line 64 using a high output impedance of 40Ω, and FIG. 5B shows the Thevinen equivalent circuit when driver 20 is driving transmission line 64 using a low output impedance of 10Ω. The termination at the receiver circuit is the same as that shown in FIG. 1A.

Consider that driver 20 is driving transmission line 64 high for an extended period of time, and VDD is 1.8 V and VSS is 0.0 V. Driver 20 will drive line 64 with a high output impedance value of 40Ω as shown in FIG. 5A, thereby forming a voltage divider with the 50Ω Thevinen resistance of the termination resistors. Accordingly, the receiver circuit will be provided with a DC signal of 1.40 V. Similarly, if driver 20 is driving transmission line 64 line low for an extended period of time, the voltage divider will provide the receiver circuit with a DC signal of 0.40 V.

Now consider that driver 20 is driving transmission line 64 with a series values alternating at the maximum switching rate. Driver 20 will drive line 64 with a low output impedance value of 10Ω as shown in FIG. 5B, thereby forming a voltage divider with the 50Ω Thevinen resistance of the termination resistors. Since driver 20 only operates in low impedance mode when switching at the maximum rate, the receiver circuit will never see the DC values formed by the voltage divider. However, these DC values are still important for calculating the signal swing when switching at the maximum rate. With the resulting voltage divider shown in FIG. 5B, the low value is 0.15 V and the high value is 1.65 V.

If transmission line 64 where lossless, the signal provided to the receiver circuit would swing between the high and low DC values. Accordingly, the signal swing would be 1.50 V. However, because of skin effect losses of transmission line 64, the signal swing will be attenuated when the signal is switching at high frequencies. A nominal attenuation for a circuit such as that shown in FIG. 1A is 40%. Of course, the magnitude of attenuation will vary with frequency and the characteristics of transmission line 64. Applying the nominal attenuation to the lossless signal swing results in a signal swing of 0.90 V. For comparison purposes, note that the nominal attenuation of 40% is the same as that used in the discussion of FIGS. 1A and 1B above.

Figure 6:
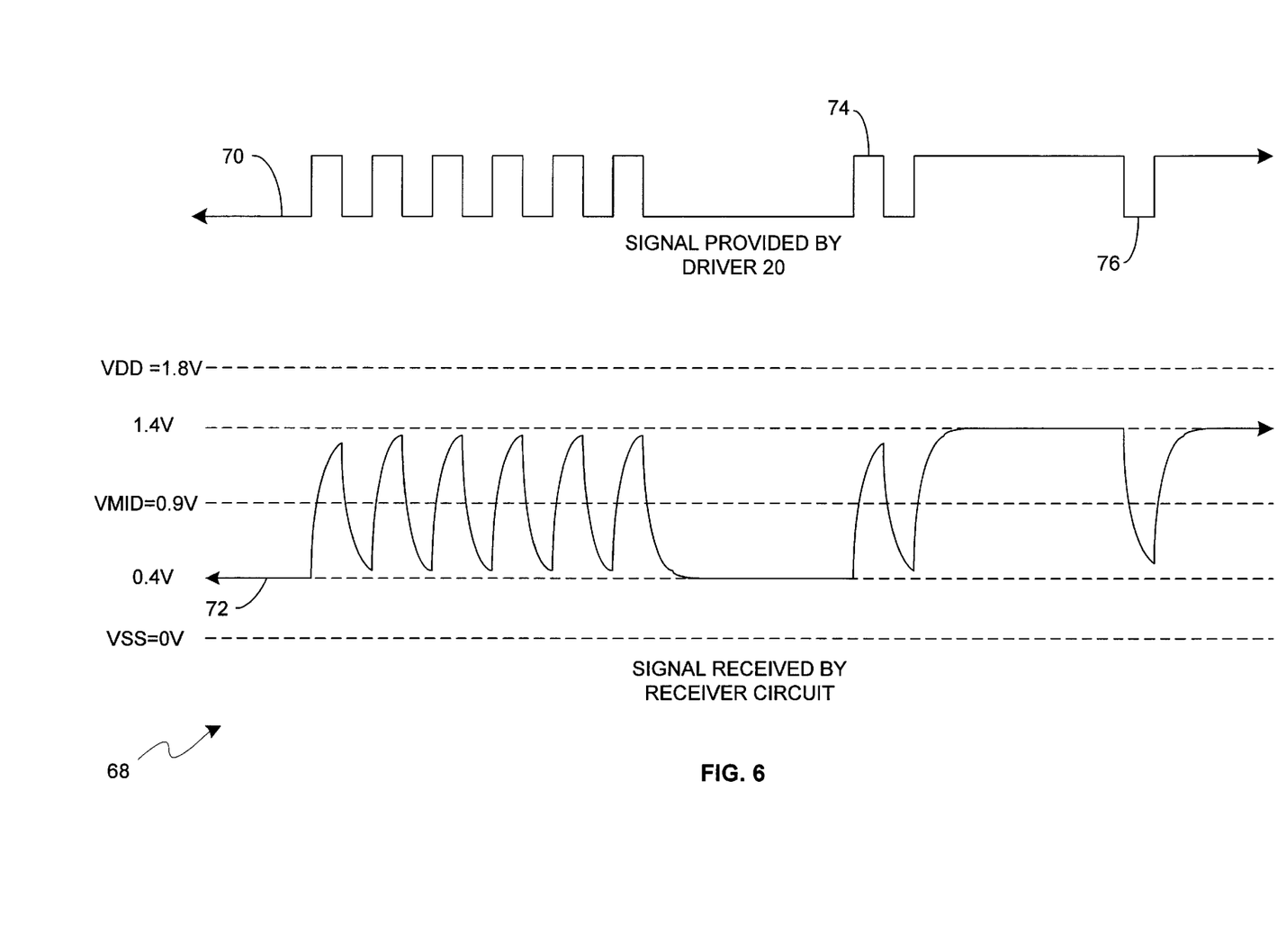
FIG. 6 shows a timing diagram of a signal applied to the driver shown in FIG. 3, and the resulting waveform 72 observed at a receiver unit.

FIG. 6 shows a timing diagram of a signal 70 applied to driver 20 of FIG. 3 and the resulting waveform 72 observed at the receiver circuit. Again, for comparison purposes the signal 70 is the same as the signal 15 in FIG. 2. Assume that signal 70 has been low for an extended period of time. Since driver 20 is driving the signal using a high output impedance of 40Ω, signal 72 has discharged down to the low DC value of 0.40 V, as described above. When the first pulse of a series of high-frequency pulses in signal 70 is transmitted at driver 20, signal 72 will rise 0.90, which is the signal swing calculated above. Accordingly, the pulse will rise to 1.30 V, which is significantly above the receiver detection threshold of 0.90 V. Note that the "eye opening" of this first pulse in signal 72 is excellent, and the pulse will be properly detected by the receiver circuit. Also note that the first pulse is almost completely centered about the average signal value.

Since the first pulse in signal 72 is almost completely centered about the average signal value, the remaining pulses in the series will also be centered about the average signal value, and all eye openings in the series will be excellent. After the last pulse in the series, signal 70 remains low for several cycles, and signal 72 once again discharges down to the low DC value of 0.40 V.

After several low cycles, signal 70 once again goes high at pulse 74. Once again, the result is a pulse in signal 72 having an excellent eye opening. Signal 70 then goes low for a cycle, and then goes high and remains high for several cycles. The result is that signal 72 charges up to the high DC value of 1.40 V.

At pulse 76, signal 70 goes low for a single cycle. Since the signal swing is 0.90 V, and the signal starts at 1.40 V, signal 16 will only fall to 0.50 V, which is significantly below the receiver detection threshold of 0.90 V. Accordingly, the pulse in signal 16 produced by pulse 76 in signal 70 also has an excellent eye opening.

In summary, FIG. 6 clearly illustrates how the present invention compensates for skin effect loses in transmission lines. The higher output impedance used while transmitting low frequency signal components causes the DC starting points to move closer to the detection threshold of the receiver, while the lower output impedance used while transmitting high frequency signal components causes the high frequency signal swing to be greater.

The present invention offers several advantages over the FIR filter technique taught in the prior art. First, as seen in FIG. 3, the implementation is very simple and consumes relatively few gates of the integrated circuit. Also, the driver of the present invention introduces very little propagation delay. In addition, the present invention is easily extended to future and past generations of MOS technology.

Finally, the concepts presented herein can be extended to a driver having more than two impedance modes. For example, a long data stream of "0"s or "1"s, which has relatively low frequency components, can be driven using a high-impedance mode. A data stream having relatively mid-range frequency components, such as "001100110011" can be driven using a medium impedance mode. Finally, a data stream having high-frequency components, such as "01010101" can be driven at the lowest impedance. By providing additional latches, any symbol pattern can be detected and the appropriate impedance for that symbol pattern can be used to drive the data.

Although the present invention has been described with reference to preferred embodiments, workers skilled in the art will recognize that changes may be made in form and detail without departing from the spirit and scope of the invention.

What is claimed is:

1. A driver circuit for driving a transmission line comprising:

an input for receiving an input signal stream to be transmitted;

a symbol detector coupled to receive the input signal stream, for detecting symbols in the input signal stream; and an output driver coupled to the symbol detector and coupled to receive the input signal stream, and providing an output signal stream at an output, wherein the output driver drives the output signal stream at a lower output impedance when higher frequency symbols are detected by the symbol detector, and drives the output signal stream at a higher output impedance when lower frequency symbols are detected by the symbol detector.

2. The driver circuit of claim 1 wherein the symbol detector comprises at least one single bit storage element that a previous transmitted value.

3. The driver circuit of claim 1 wherein the output driver uses a higher output impedance if the value being transmitted is the same as the previous value transmitted, and uses a lower output impedance if the value being transmitted is different than the previous value being transmitted.

4. The driver circuit of claim 3 wherein the higher output impedance is 40 Ω and the lower output impedance is 10 Ω.

5. The driver circuit of claim 1 wherein the output is coupled to a first end of a transmission line.

6. The driver circuit of claim 5 wherein a second end of the transmission line is coupled to a receiver.

7. The driver circuit of claim 6 wherein the second end of the transmission line is terminated with a termination resistance.

8. The driver circuit of claim 1 wherein the output driver includes a first pair of output transistors that are always switched when transmitting values.

9. The driver circuit of claim 8 wherein the output driver includes a second pair of output transistors that switch in parallel with the first pair of output transistors only when the output driver the output signal stream at the lower impedance.

10. A method of transmitting an output signal comprising:

receiving an input signal containing a data stream;

detecting symbols in the data stream;

driving the output signal at a higher output impedance using the data stream when lower frequency symbols are detected; and driving the output signal at a lower output impedance using the data stream when higher frequency symbols are detected.

11. The method of claim 10 wherein driving the output signal at a higher output impedance using the data stream when lower frequency symbols are detected comprises driving the data stream at a high output impedance when the value being transmitted is identical to the immediately previous value transmitted, and driving the output signal at a lower output impedance using the data stream when higher frequency symbols are detected comprises driving the data stream at a low output impedance when the value being transmitted is different than the immediately previous value transmitted.

* * * * *